(12) United States Patent
Kojima

(10) Patent No.: US 8,400,201 B2
(45) Date of Patent: Mar. 19, 2013

(54) DELAY SIGNAL GENERATOR

(75) Inventor: Kazumi Kojima, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 50 days.

(21) Appl. No.: 12/605,722

(22) Filed: Oct. 26, 2009

(65) Prior Publication Data
US 2010/0102863 A1    Apr. 29, 2010

(30) Foreign Application Priority Data
Oct. 27, 2008    (JP) ................................ 2008-275940

(51) Int. Cl.
*H03H 11/06*    (2006.01)
(52) U.S. Cl. ........................ 327/261; 327/264
(58) Field of Classification Search .................. 327/261, 327/264, 265
See application file for complete search history.

(56) References Cited

U.S. PATENT DOCUMENTS

| | | | | |
|---|---|---|---|---|
| 6,020,773 A * | 2/2000 | Kan et al. | ........................ | 327/271 |
| 6,194,937 B1 * | 2/2001 | Minami | ........................ | 327/270 |
| 7,135,906 B2 * | 11/2006 | Takai et al. | ........................ | 327/263 |
| 7,276,950 B2 * | 10/2007 | Monma et al. | ........................ | 327/262 |
| 7,486,125 B2 * | 2/2009 | Chae | ........................ | 327/285 |
| 7,605,628 B2 * | 10/2009 | Magee et al. | ........................ | 327/261 |
| 7,644,331 B2 * | 1/2010 | Haugestuen | ........................ | 714/731 |

FOREIGN PATENT DOCUMENTS

| | | |
|---|---|---|
| JP | 06-164339 | 6/1994 |
| JP | Hei-06-326570 A | 11/1994 |
| JP | Hei-08-37448 A | 2/1996 |
| JP | 10-322178 | 12/1998 |

OTHER PUBLICATIONS

Japanese Office Action mailed Nov. 28, 2012 for corresponding Japanese Application No. 2008-275940, with English-language translation.

* cited by examiner

*Primary Examiner* — Hai L Nguyen
(74) *Attorney, Agent, or Firm* — Fujitsu Patent Center

(57) ABSTRACT

A delay clock generator includes a plurality of delay element arrays arranged in parallel; a feed side transfer line and a return side transfer line provided in each of the delay elements which make up the delay element arrays, and that transfer a clock signal in a feed direction and a return direction; a selector selecting a first transfer route that couples the feed side transfer lines to each other along the preceding and succeeding delay elements and a third transfer route that couples the return side transfer lines to each other along the preceding and succeeding delay elements, and a second transfer route that couples the feed side transfer lines and the return side transfer lines of each of the delay elements; and a decoder causing the selector to select the second transfer route for one of the delay elements in the delay element array.

8 Claims, 14 Drawing Sheets

FIG. 9

| icode (INTERNAL DLI) | | AFTER icode MUX (BINARY NUMBER) | D/U NEEDS TO BE ACTIVATED | BLK DEC. RELATED | | MAIN DEC. RELATED | | SUB DEC. RELATED SUB DEC. SIGNAL (SDz) | | | |
|---|---|---|---|---|---|---|---|---|---|---|---|
| (DECIMAL NUMBER) | (BINARY NUMBER) | | | SELECTED BLK DEC. | bds (bd-0~3) | CONTROL D/U WHERE LOOPBACK IS PERFORMED | mds (md-0~3) | (sd0-0~3) | (sd1-0~3) | (sd2-0~3) | (sd3-0~3) |
| 0  | 00 00 | 00 00 | du-0     | bd-0 | 1111 | md-0 | 1111 | 1111 | 1111 | 1111 | 1111 |
| 1  | 00 01 | 00 01 | du-0~1   | bd-0 | 1111 | md-1 | 0111 | 0111 | 1111 | 1111 | 1111 |
| 2  | 00 10 | 00 10 | du-0~2   | bd-0 | 1111 | md-2 | 0011 | 0011 | 1111 | 1111 | 1111 |
| 3  | 00 11 | 00 11 | du-0~3   | bd-0 | 1111 | md-3 | 0001 | 0001 | 1111 | 1111 | 1111 |
| 4  | 01 00 | 01 11 | du-0~4   | bd-1 | 0111 | md-2 | 0001 | 0000 | 1111 | 1111 | 1111 |
| 5  | 01 01 | 01 10 | du-0~5   | bd-1 | 0111 | md-1 | 0011 | 0000 | 1110 | 1111 | 1111 |
| 6  | 01 10 | 01 01 | du-0~6   | bd-1 | 0111 | md-0 | 0111 | 0000 | 1100 | 1111 | 1111 |
| 7  | 01 11 | 01 00 | du-0~7   | bd-1 | 0111 | -    | 1111 | 0000 | 1000 | 1111 | 1111 |
| 8  | 10 00 | 10 00 | du-0~8   | bd-2 | 0011 | md-0 | 1111 | 0000 | 0000 | 1111 | 1111 |
| 9  | 10 01 | 10 01 | du-0~9   | bd-2 | 0011 | md-1 | 0111 | 0000 | 0000 | 0111 | 1111 |
| 10 | 10 10 | 10 10 | du-0~10  | bd-2 | 0011 | md-2 | 0011 | 0000 | 0000 | 0011 | 1111 |
| 11 | 10 11 | 10 11 | du-0~11  | bd-2 | 0011 | md-3 | 0001 | 0000 | 0000 | 0001 | 1111 |
| 12 | 11 00 | 11 11 | du-0~12  | bd-3 | 0001 | md-2 | 0001 | 0000 | 0000 | 0000 | 1111 |
| 13 | 11 01 | 11 10 | du-0~13  | bd-3 | 0001 | md-1 | 0011 | 0000 | 0000 | 0000 | 1110 |
| 14 | 11 10 | 11 01 | du-0~14  | bd-3 | 0001 | md-0 | 0111 | 0000 | 0000 | 0000 | 1100 |
| 15 | 11 11 | 11 00 | du-0~15  | bd-3 | 0001 | -    | 1111 | 0000 | 0000 | 0000 | 1000 |

FIG. 11

| INTERNAL DLI | BLK [1:0] | SUB-DECODE SIGNAL mds 0~7 | 8~15 | | 48~55 | 56~63 |
|---|---|---|---|---|---|---|
| 0 | 00 | 11111111 | 11111111 | ... | 11111111 | 11111111 |
| 1 | 00 | 01111111 | 11111111 | ... | 11111111 | 11111111 |
| 2 | 00 | 00111111 | 11111111 | ... | 11111111 | 11111111 |
| 3 | 00 | 00011111 | 11111111 | ... | 11111111 | 11111111 |
| 4 | 00 | 00001111 | 11111111 | ... | 11111111 | 11111111 |
| ... | ... | ... | ... | ... | ... | ... |
| 59 | 00 | 00000000 | 00000000 | ... | 00000000 | 00011111 |
| 60 | 00 | 00000000 | 00000000 | ... | 00000000 | 00000111 |
| 61 | 00 | 00000000 | 00000000 | ... | 00000000 | 00000011 |
| 62 | 00 | 00000000 | 00000000 | ... | 00000000 | 00000001 |
| 63 | 00 | 00000000 | 00000000 | ... | 00000000 | 00000001 |
| 64 | 01 | 00000000 | 00000000 | ... | 00000000 | 00000001 |
| 65 | 01 | 00000000 | 00000000 | ... | 00000000 | 00000001 |
| 66 | 01 | 00000000 | 00000000 | ... | 00000000 | 00000011 |
| 67 | 01 | 00000000 | 00000000 | ... | 00000000 | 00000111 |
| 68 | 01 | 00000000 | 00000000 | ... | 00000000 | 00011111 |
| ... | ... | ... | ... | ... | ... | ... |
| 123 | 01 | 00001111 | 11111111 | ... | 11111111 | 11111111 |
| 124 | 01 | 00011111 | 11111111 | ... | 11111111 | 11111111 |
| 125 | 01 | 00111111 | 11111111 | ... | 11111111 | 11111111 |
| 126 | 01 | 01111111 | 11111111 | ... | 11111111 | 11111111 |
| 127 | 01 | 11111111 | 11111111 | ... | 11111111 | 11111111 |
| 128 | 10 | 11111111 | 11111111 | ... | 11111111 | 11111111 |
| 129 | 10 | 01111111 | 11111111 | ... | 11111111 | 11111111 |
| 130 | 10 | 00111111 | 11111111 | ... | 11111111 | 11111111 |
| 131 | 10 | 00011111 | 11111111 | ... | 11111111 | 11111111 |
| ... | ... | ... | ... | ... | ... | ... |
| 189 | 10 | 00000000 | 00000000 | ... | 00000000 | 00000111 |
| 190 | 10 | 00000000 | 00000000 | ... | 00000000 | 00000011 |
| 191 | 10 | 00000000 | 00000000 | ... | 00000000 | 00000001 |
| 192 | 11 | 00000000 | 00000000 | ... | 00000000 | 00000001 |
| 193 | 11 | 00000000 | 00000000 | ... | 00000000 | 00000011 |
| 194 | 11 | 00000000 | 00000000 | ... | 00000000 | 00000111 |
| ... | ... | ... | ... | ... | ... | ... |
| 253 | 11 | 00111111 | 11111111 | ... | 11111111 | 11111111 |
| 254 | 11 | 01111111 | 11111111 | ... | 11111111 | 11111111 |
| 255 | 11 | 11111111 | 11111111 | ... | 11111111 | 11111111 |

FIG. 12

| INTERNAL DLI | BLK [1:0] | SUB-DECODE SIGNAL SDz BLK-0 | | | |
|---|---|---|---|---|---|
| | | 0~7 | 8~15 | 48~55 | 56~63 |
| 0 | 00 | 11111111 | 11111111 | ... 11111111 | 11111111 |
| 1 | 00 | 01111111 | 11111111 | ... 11111111 | 11111111 |
| 2 | 00 | 00111111 | 11111111 | ... 11111111 | 11111111 |
| 3 | 00 | 00011111 | 11111111 | ... 11111111 | 11111111 |
| 4 | 00 | 00001111 | 11111111 | ... 11111111 | 11111111 |
| ... | ... | ... | ... | ... ... | ... |
| 59 | 00 | 00000000 | 00000000 | ... 00000000 | 00011111 |
| 60 | 00 | 00000000 | 00000000 | ... 00000000 | 00001111 |
| 61 | 00 | 00000000 | 00000000 | ... 00000000 | 00000111 |
| 62 | 00 | 00000000 | 00000000 | ... 00000000 | 00000011 |
| 63 | 00 | 00000000 | 00000000 | ... 00000000 | 00000001 |

| INTERNAL DLI | BLK [1:0] | SUB-DECODE SIGNAL SDz BLK-1 | | | |
|---|---|---|---|---|---|
| | | 0~7 | 8~15 | 48~55 | 56~63 |
| 64 | 01 | 11111111 | 11111111 | ... 11111111 | 11111111 |
| 65 | 01 | 11111111 | 11111111 | ... 11111111 | 11111110 |
| 66 | 01 | 11111111 | 11111111 | ... 11111111 | 11111100 |
| 67 | 01 | 11111111 | 11111111 | ... 11111111 | 11111000 |
| 68 | 01 | 11111111 | 11111111 | ... 11111111 | 11110000 |
| ... | ... | ... | ... | ... ... | ... |
| 123 | 01 | 11111000 | 00000000 | ... 00000000 | 00000000 |
| 124 | 01 | 11110000 | 00000000 | ... 00000000 | 00000000 |
| 125 | 01 | 11100000 | 00000000 | ... 00000000 | 00000000 |
| 126 | 01 | 11000000 | 00000000 | ... 00000000 | 00000000 |
| 127 | 01 | 10000000 | 00000000 | ... 00000000 | 00000000 |

| INTERNAL DLI | BLK [1:0] | SUB-DECODE SIGNAL SDz BLK-2 | | | |
|---|---|---|---|---|---|
| | | 0~7 | 8~15 | 48~55 | 56~63 |
| 0 | 10 | 11111111 | 11111111 | ... 11111111 | 11111111 |
| 1 | 10 | 01111111 | 11111111 | ... 11111111 | 11111111 |
| 2 | 10 | 00111111 | 11111111 | ... 11111111 | 11111111 |
| 3 | 10 | 00011111 | 11111111 | ... 11111111 | 11111111 |
| 4 | 10 | 00001111 | 11111111 | ... 11111111 | 11111111 |
| ... | ... | ... | ... | ... ... | ... |
| 59 | 10 | 00000000 | 00000000 | ... 00000000 | 00011111 |
| 60 | 10 | 00000000 | 00000000 | ... 00000000 | 00001111 |
| 61 | 10 | 00000000 | 00000000 | ... 00000000 | 00000111 |
| 62 | 10 | 00000000 | 00000000 | ... 00000000 | 00000011 |
| 63 | 10 | 00000000 | 00000000 | ... 00000000 | 00000001 |

DELAY SIGNAL GENERATOR

CROSS-REFERENCE TO RELATED APPLICATIONS

This application is based upon and claims the benefit of priority of the prior Japanese Patent Application No. 2008-275940, filed on Oct. 27, 2008, the entire contents of which are incorporated herein by reference.

FIELD

This disclosure relates to a delay signal generator.

BACKGROUND

FIG. 1 illustrates a conventional digital delay locked loop (DLL) circuit. The digital DLL circuit includes a delay generation unit 1, and decoders 2a and 2b for selecting a delay time that is generated at the delay generation unit 1. The delay generation unit 1 is provided with multiple delay element arrays 4a to 4d (in FIG. 1, four arrays) to which multiple delay elements 3 are coupled in a column direction (along X direction), and respective delay elements 5a to 5d are arranged adjacent to respective delay element arrays 4a to 4d. Delay times of respective delay elements 3 and those of 5a to 5d are the same.

In the delay generation unit 1, an input clock signal CLKin that is input to the delay element 5a is output to the delay element 5d as an output clock signal CLKout via each of the delay element arrays 4a to 4d and the delay elements 5b and 5c. A delay time of the output clock signal CLKout for the input clock signal CLKin is adjusted at the decoders 2a and 2b by selecting the number of the delay elements in delay element arrays 4a to 4d and the delay elements 5a to 5d where the clock signal passes.

The decoder 2a outputs a selection signal SLy1 obtained by decoding the input code "icode" to delay elements 3 which are located in the row direction (Y direction) of the delay element arrays 4a to 4d. A delay time for an output clock signal CLKout may be adjusted by increasing or decreasing the number of delay elements in units of four that are serially coupled between 5a and 5d by each selection signal SLy1.

The decoder 2b outputs a selection signal SLy2 that is obtained by decoding an input code "icode" to each of the delay elements 5a to 5d. Then, the delay elements 5a to 5d are selected by each selection signal SLy2 in a range of 1 to 4.

Thus, the delay time for the output clock signal CLKout may be adjusted for a delay time of one delay element as a minimum step by the selection signals SLy1 and SLy2.

The above described digital DLL circuit may adjust a delay time by operation of the decoder 2a and the decoder 2b for a delay time of one delay element as a minimum step. However, delay times for selected delay elements in the row direction of delay element arrays 4a to 4d and for delay elements 5a to 5d do not match due to differences in wiring capacity, etc.

As a result, as illustrated in FIG. 2, when the input code "icode" is sequentially changed, especially when delay elements are increased in units of four by the selection signal SLy1, there is a drawback that linearity of the changes in the delay time DT is deteriorated.

Japanese Laid-open Patent Publication No. H 8-37448 discloses a ring oscillator that provides multiple oscillation characteristics by selecting outputs of multiple unit delay units at a selector circuit and feeding the outputs back to unit delay units of a first stage. However, the publication does not disclose a method to improve linearity of the adjusted delay times.

Japanese Laid-open Patent Publication No. H 6-326570 discloses a variable delay circuit that improves linearity of the delay characteristics by selecting delay signals output from a delay gate circuit coupled in cascade at a selector.

However, in order to select delay signals output from each delay gate circuit, the number of selectors required may be as many as the number of delay gate circuits. As a result, the scale of the circuit increases. Moreover, multiple selectors are serially interposed on the output route of delay signals, thus, variations in selectors lead to variations in delay signals. Hence, sufficient linearity may not be achieved if a variable delay circuit is configured in which a delay signal is selected at a very small delay step with many stages.

SUMMARY

According to an aspect of the embodiment, a delay clock generator includes a plurality of delay element arrays arranged in parallel; a feed side transfer line and a return side transfer line provided in each of the delay elements that make up the delay element arrays, and transferring a clock signal in a feed direction and a return direction; a selector for selecting a first transfer route that couples the feed side transfer lines to each other along the preceding and succeeding delay elements and a third transfer route that couples the return side transfer lines to each other along the preceding and succeeding delay elements, and for selecting a second transfer route that couples the feed side transfer lines and the return side transfer lines for each of the delay elements; and a decoder for causing the selector to select the second transfer route for one of the delay elements in the delay element array.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9 illustrates the decode signals in FIG. 5;

FIG. 11 illustrates another example of the decode signals in FIG. 5;

FIG. 12 illustrates yet another example of the decode signals in FIG. 5;

DESCRIPTION OF EMBODIMENT

Figure 1:
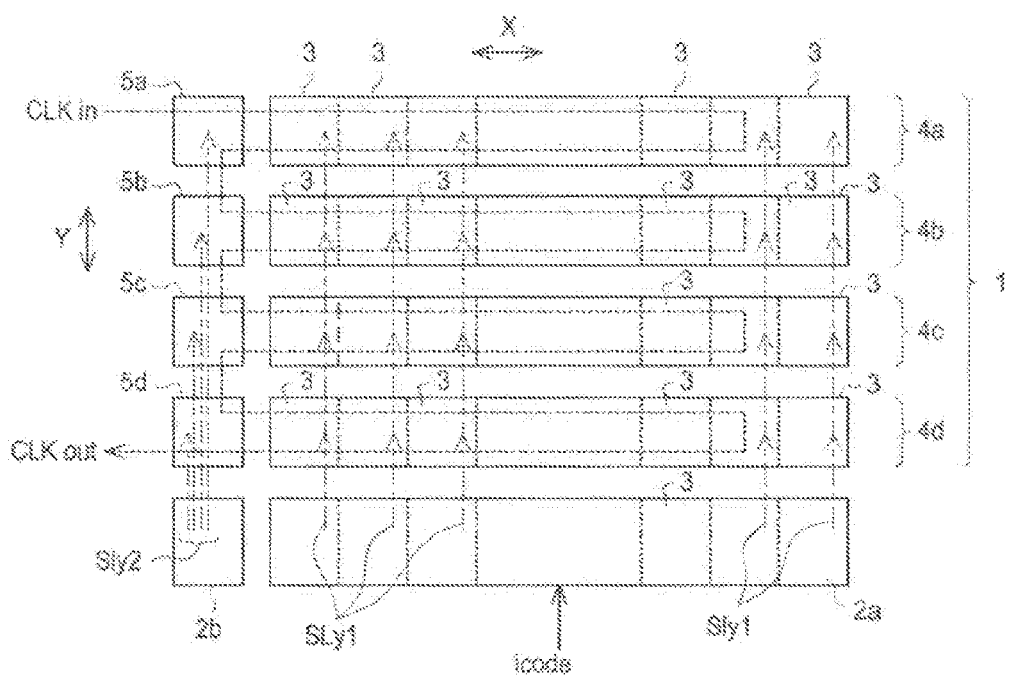
FIG. 1 illustrates a conventional digital delay locked loop (DLL) circuit.
Figure 2:
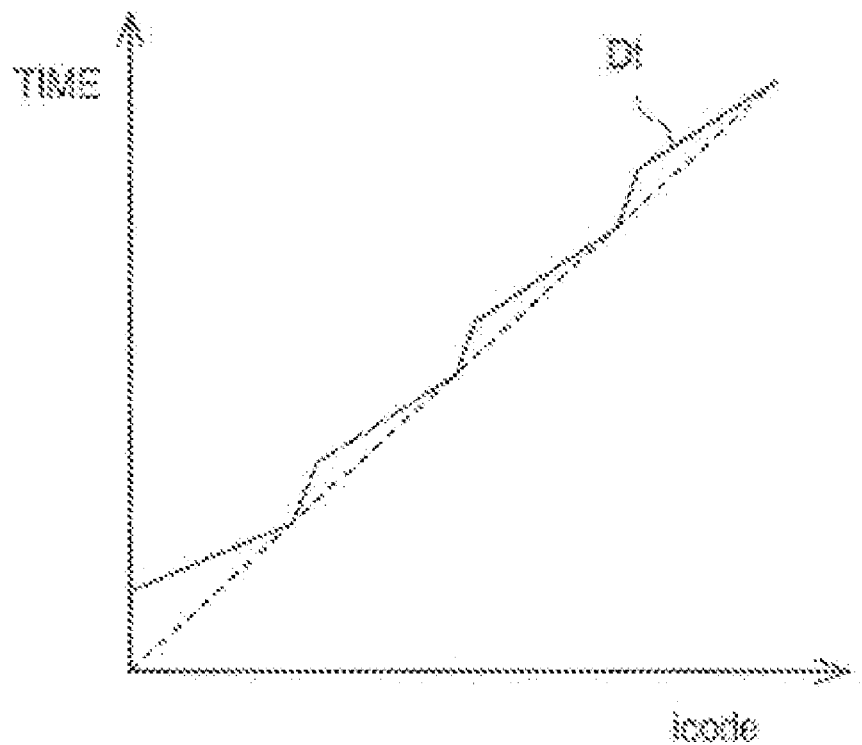
FIG. 2 illustrates a relationship between input codes and delay times of a conventional digital DLL circuit.
Figure 3:
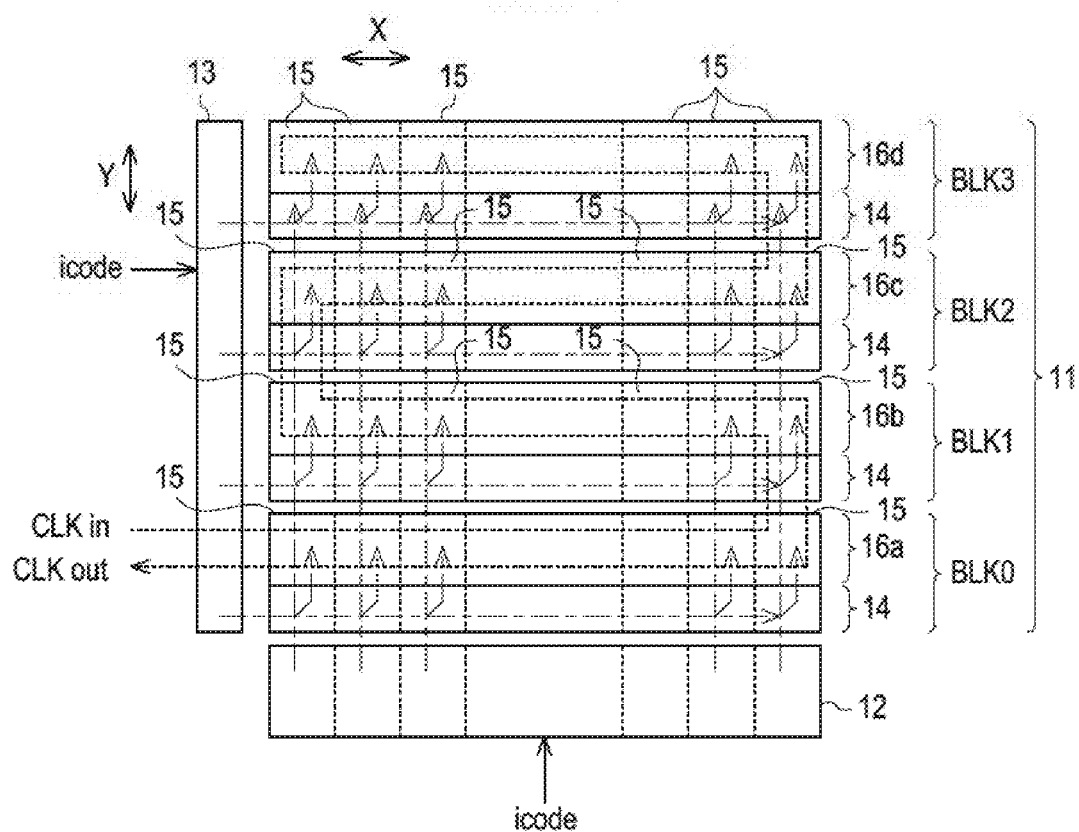
FIG. 3 illustrates an example of a digital DLL circuit according to an embodiment.

One aspect of a digital delay locked loop (DLL) circuit which embodies the present disclosure will be described by referring to the accompanying drawings. A digital DLL circuit illustrated in FIG. 3 includes a delay generation unit 11, a main decoder 12 for selecting a delay time that is generated at the delay generation unit 11, a block decoder unit 13, and a sub-decoder 14.

The delay generation unit 11 is provided with delay element arrays 16a to 16d (in FIG. 3, four arrays) in each of which a plurality of delay elements 15 are coupled in a row direction (X direction). An input clock signal CLKin is input to a delay element 15 at one end of the delay element array 16a and an output clock signal CLKout is output from the same delay element 15.

The number of delay elements through which the clock signal CLK passes is selected by selecting delay elements 15 in delay element arrays 16a to 16d via the sub-decoder 14 based on an input code "icode" input to the main decoder 12 and the block decoder unit 13. Through this operation, a delay time of the output clock signal CLKout corresponding to the input clock signal CLKin is selected.

Figure 4:
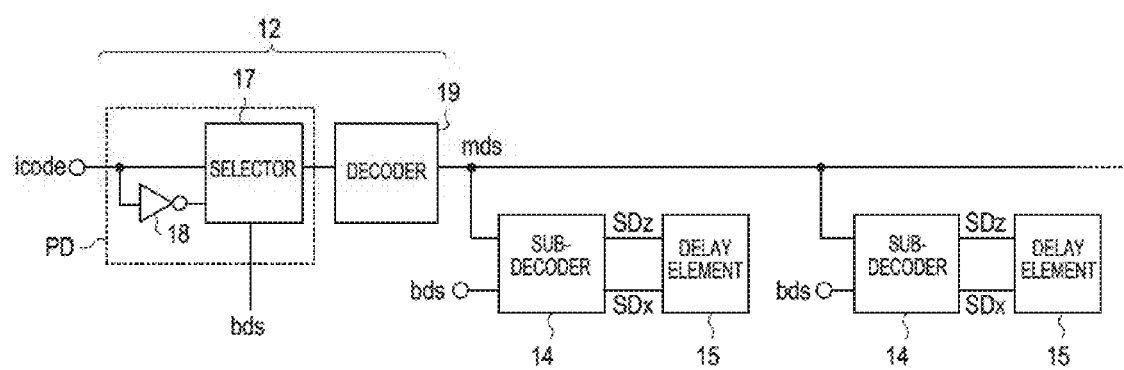
FIG. 4 illustrates a hierarchical structure of the main decoders and the sub-decoders in FIG. 3.

FIG. 4 illustrates a configuration of the main decoder 12. The input code "icode" is input into a pre-decode unit PD.

At respective pre-decode units PD0 to PD3, a multi-bit input code "icode" is input directly into a selector 17 and is also input into the selector 17 via an inverter circuit 18. Block decode signals "bds" that correspond to respective blocks BLK0 to BLK3 are input to the selector 17.

At the blocks BLK0 and BLK2, an "icode" is selected at the selector 17 by the block decode signal "bds" and output to a decoder 19. At the blocks BLK1 and BLK3, an output signal of an inverter circuit 18, which is obtained by inverting the "icode", is selected at the selector 17 by the block decode signal "bds" and output to the decoder 19. The output signal of the inverter circuit 18 is made up of lower order bits than the input code "icode".

The decoder 19 outputs, to respective sub-decoders 14 in each row of blocks BLK 0 to BLK 3, main decode signals "mds" obtained by decoding the output signals of the pre-decode units PD.

Each sub-decoder 14 outputs sub-decode signals SDz and SDx to the delay elements 15 based on the main decode signal "mds" and the block decode signal "bds."

Now, configurations of the main decoder 12, the block decoder unit 13, the sub-decoder 14, and the delay elements that make up the delay generation unit 11 will be described. In order to simplify the explanation, as illustrated in FIG. 5, the delay generation unit 11 is assumed to be configured with 4×4 delay elements du-0 to du-15 in row and column directions.

Figure 5:
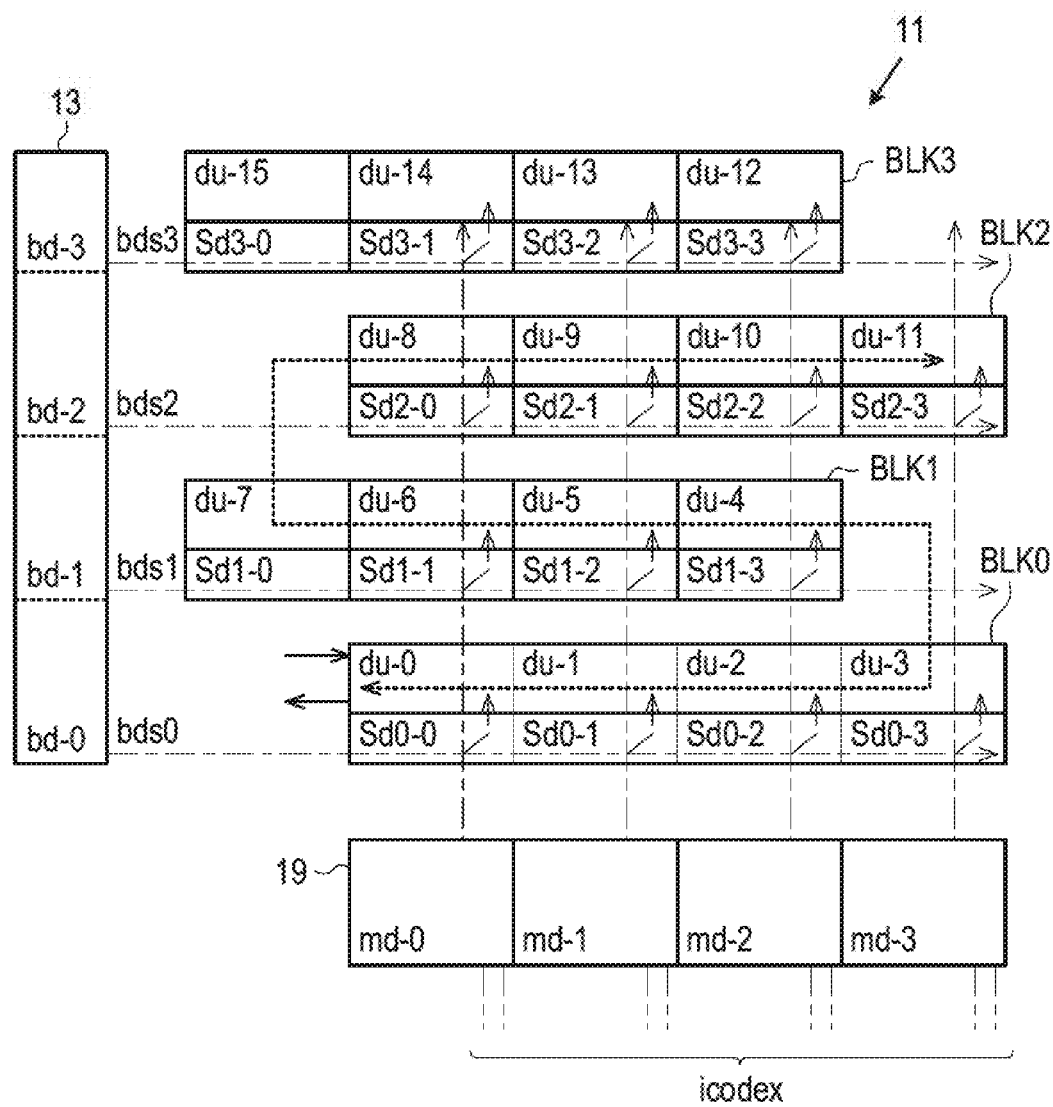
FIG. 5 illustrates the delay generation units and the decoders in FIG. 3.

As illustrated in FIG. 5, the delay generation unit 11 includes four blocks, BLK0 to BLK3. The block BLK 0 includes delay elements du-0 to du-3 and sub-decoders sd0-0 to sd0-3 for selecting each of the delay elements du-0 to du-3.

The block BLK1 includes delay elements du-4 to du-7 and sub-decoders sd1-3 to sd1-0 for selecting each of the delay elements du-4 to du-7. The block BLK2 includes delay elements du-8 to du-11 and sub-decoders sd2-0 to sd2-3 for selecting each of the delay elements du-8 to du-11. Likewise, the block BLK3 includes delay elements du-12 to du-15 and sub-decoders sd3-3 to sd3-0 for selecting each of the delay elements du-12 to du-15.

In FIG. 5, the decoder 19 includes main decoders md0 to md3, and the block decoder unit 13 includes block decoders bd-0 to bd-3 that correspond to blocks BLK 0 to BLK3.

Figure 6:
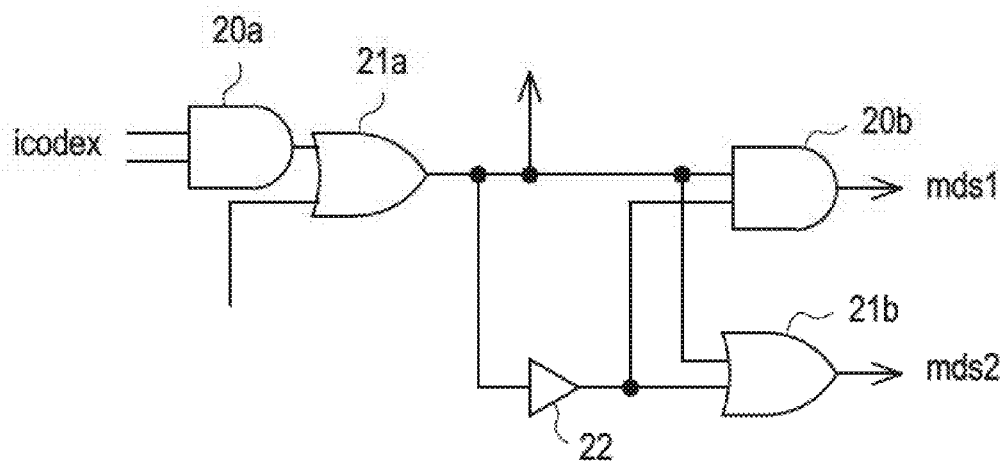
FIG. 6 illustrates the main decoders in FIG. 3.

FIG. 6 illustrates a configuration of the main decoders md-1 to md-3. The lower order bits of the input code "icodex" output from the selector 17 are input to an AND circuit 20a, and the output signal from the AND circuit 20a is input to an OR circuit 21a.

The output signal from the OR circuit 21a is input to an AND circuit 20b and an OR circuit 21b, and also input to the AND circuit 20b and the OR circuit 21b via a buffer circuit 22. A main decode signal mds1 is output from the AND circuit 20b, and a main decode signal mds2 is output from the OR circuit 21b.

According to above configuration, both main decode signals, mds1 and mds2, are H level or L level. If all input codes "icodex" are H level, both of the main decode signals mds1 and mds2 become H level.

The output signal of the OR circuit 21a is output to an adjacent main decoder. For example, in the case of the main decoder md-0, the output signal is output to the main decoder md-1, and in the case of the main decoder md-1, the output signal is output to the main decoder md-2. Moreover, the output signal of the OR circuit 21a is input to an adjacent main decoder. For example, in the case of main decoder md-2, the output signal from the main decoder md-1 is input, in the case of the main decoder md-3, the output signal from the main decoder md-2 is input. Note that no signal is input from any main decoder to the main decoder md-0, thus the md-0 does not have any OR circuit 21a, and an output signal from the AND circuit 20a is output to the OR circuit 21a of the main decoder md-1.

Figure 7A:
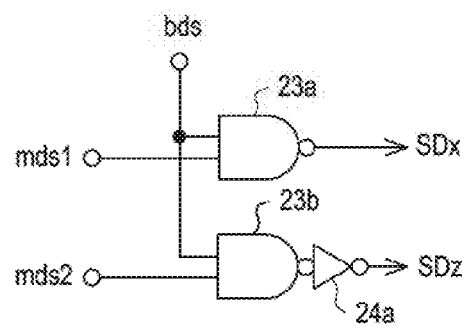
FIGS. 7A and 7B illustrate the sub-decoders in FIG. 3.

FIG. 7A illustrates a configuration of sub-decoders sd0-0 to sd0-3 of block BLK0 and sd2-0 to sd2-3 of block BLK2. The main decode signals mds-1 and mds-2 are input to the NAND circuits 23a and 23b to which block decode signals bds are input from one of the block decoders bd-1 or bd-3.

The NAND circuit 23a outputs a sub-decode signal SDx. The output signal from the NAND circuit 23b is inverted at the inverter circuit 24a and output as a sub-decode signal SDz.

In above configuration, if a block decode signal "bds" becomes L level, the sub-decode signal SDx is fixed to H level, and the sub-decode signal SDz is fixed to L level. Moreover, if the block decode signal "bds" becomes H level, the sub-decode signal SDx becomes the inversion signal of the main decode signals mds-1 and mds-2, and the sub-decode signal SDz becomes in phase with the main decode signals mds-1 and mds-2.

Figure 7B:
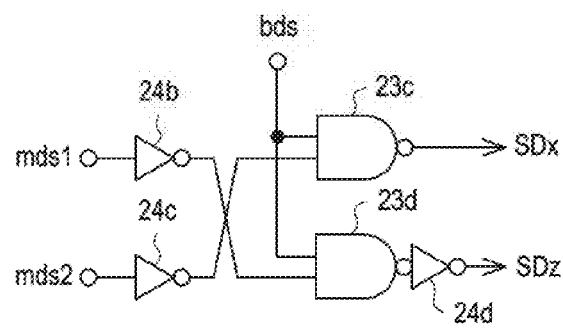

FIG. 7B illustrates a configuration of the sub-decoders sd1-0 to sd1-3 of the block BLK1 and the sub-decoders sd3-0 to sd3-3 of the block BLK3. The main decode signals mds-1 and mds-2 are input to inverter circuits 24b and 24c respectively, and the output signals of the inverter circuits 24b and 24c are input to NAND circuits 23d and 23c respectively.

Block decode signals "bds" are input to the NAND circuits 23d and 23c from either of the block decoders bd0 or bd2.

The NAND circuit 23c outputs a sub-decode signal SDx. An output signal from the NAND circuit 23d is inverted at the inverter circuit 24d and output as a sub-decode signal SDz.

In above configuration, when a block decode signal "bds" becomes L level, the sub-decode signal SDx is fixed to H level, and the sub-decode signal SDz is fixed to L level. Moreover, when the block decode signal "bds" becomes H-level, the sub-decode signal SDx becomes in phase with the main decode signals mds1 and mds2, and the sub-decode signal SDz becomes the inversion signal of the main decode signals mds1 and mds2.

Thus, the sub-decode signals SDz and SDx output from the sub-decoders sd1-0 to sd1-3 of block BLK1 and the sub-decoders sd3-0 to sd3-3 of block BLK3 in odd number columns, and the sub-decode signals SDz and SDx output from the sub-decoders sd0-0 to sd0-3 of block BLK0 and the sub-decoders sd2-0 to sd2-3 of block BLK2 in even number columns, are in reverse phase.

Figure 8:
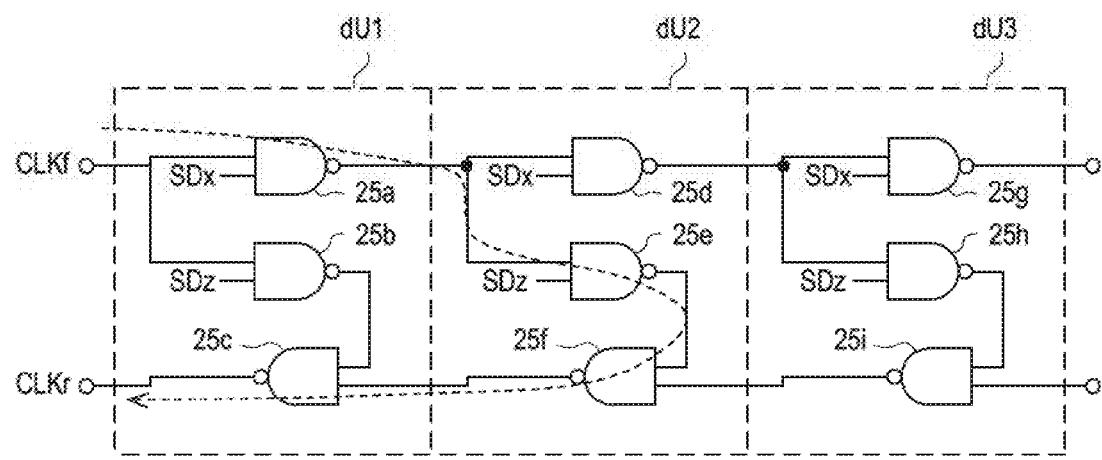
FIG. 8 illustrates the delay elements in FIG. 5.

FIG. 8 illustrates a configuration of the delay elements du. FIG. 8 illustrates a condition in which three delay elements du-1 to du-3 are coupled. A feed clock signal CLKf is input to NAND circuits (selector) 25a and 25b of the delay element du-1 via a transfer line of the feed side, and the sub-decode signal SDz is input to the NAND circuit 25b.

An output signal of the NAND circuit 25a is output to the delay element du-2 as a feed clock signal CLKf. An output signal of the NAND circuit 25b is input to the NAND circuit (selector) 25c. An output signal of the NAND circuit 25f of the delay element du-2 is input to the NAND circuit 25c as a return clock signal CLKr via a transfer line of the return side.

In the delay element du-1, if the sub-decode signal SDx becomes H level and the sub-decode signal SDz becomes L level, the NAND circuit 25b is inactivated, the output signal is fixed to H level, and the NAND circuits 25a and 25c are activated.

The input feed clock signal CLKf is transferred to the NAND circuits 25d and 25e of the delay element du-2 via the NAND circuit 25a. The return clock signal CLKr output from the delay element du2 is transferred via the NAND circuit 25c (a first transfer route).

The delay elements du-2 and du-3 operate in similar if not the same manner as the delay element du-1, through the input of the NAND circuits 25d to 25i and the sub-code signals SDx and SDz.

Now, as examples, the following operations will be described: in the case of the delay element du-1, the sub-decode signals SDx become H level and the sub-decode signals SDz become L level, and in the cases of the delay elements du-2 and du-3, the sub-decode signals SDx become L level and the sub-decode signals SDz become H level.

In the delay element du-2, an output signal of the NAND circuit 25d is fixed to H level, and the NAND circuit 25e is in a condition of outputting an inversion signal of a clock signal CLK. In the delay element du-3, an output signal of the NAND circuit 25h becomes L level, thus, an output signal of the NAND circuit 25i becomes H level. The NAND circuit 25f inverts the output signal of the NAND circuit 25e to output a return clock signal CLKr to the NAND circuit 25c of the delay element du-1 (a second transfer route).

Through above operation, the feed clock signal CLKf is looped back at the delay element du-2, and transferred as a return clock signal CLKr. At this time, in any of the delay elements du, a clock signal CLK passes two NAND circuits, thus, a delay time of the du-1 and that of du-2 may be equal.

As illustrated in FIG. 5, the block decoder bd-0 outputs the common block decode signal bds0 to sub-decoders sd0-0 to sd0-3 of delay elements du-0 to du-3 in the block BLK0. The block decoder bd-1 outputs the common block decode signal bds1 to sub-decoders sd1-3 to sd1-0 of the delay elements du-4 to du-7 of the block BLK1.

The block decoder bd2 outputs the common block decode signal bds2 to sub-decoders sd2-0 to sd2-3 of delay elements du-8 to du-11 in the block BLK2. The block decoder bd-3 outputs the common block decode signal bds3 to sub-decoders sd3-3 to sd3-0 of delay elements du-12 to du-15 in the block BLK3.

The main decoder md-0 outputs the common main decode signal to delay elements du-0, du-6, du-8 and du-14 in the blocks BLK0 to BLK3. The main decoder md-1 outputs the common main decode signal to delay elements du-1, du-5, du-9 and du-13 in the blocks BLK0 to BLK3.

The main decoder md-2 outputs the common main decode signal to delay elements du-2, du-4, du-10 and du-12 in the blocks BLK0 to BLK3. The main decoder md-3 outputs the common main decode signal to delay elements du-3 and du-11 in the blocks BLK0 and BLK2.

No main decode signal is input to delay elements du-7 and du-15 in the blocks BLK1 and BLK3, respectively. However, if the block decode signals bds1 in block BLK1 and bds3 in block BLK3 become H level, the sub-decode signal SDz becomes H level, and the sub-decode signal SDx becomes L level by the operation of the sub-decoder illustrated in FIG. 7B. Therefore, the delay elements du-7 and du-15 operate so that a clock signal CLK is looped back.

An input clock signal CLKin is input to the delay element du-0 as a feed clock signal CLKf. An output clock signal CLKout is a return clock signal CLKr output from the delay element du-0.

FIG. 9 illustrates signals at each unit generated by the operation of the digital DLL circuit illustrated in FIG. 5. The input code "icode" is input by a four-bit signal that corresponds to 0 to 15 in decimal numbers, and the number of stages of delay elements du may be selected within a range of 1 to 16 stages by each input code "icode."

The "icodex" is a code generated at the selector 17 based on an input code "icode." The "icodex" for selecting blocks BLK0 and BLK2 is similar, if not the same, as the input code "icode." The "icodex" for selecting blocks BLK1 and BLK3 is a code that inverts the lower two bits of the input code "icode." The signals of the lower two bits are input to the main decoders md-0 to md-3.

Above described "icodex", the main decode signals mds output from main decoders md-0 to md-3 change from 1111 to 0001 when a selection is made so that delay elements in the blocks BLK0 and BLK2 increase. Conversely, the main decode signals mds change from 0001 to 1111 when a selection is made so that delay elements in the blocks BLK1 and BLK3 increase.

Thus, in the blocks BLK0 and BLK2, when the number of delay elements selected by an input code "icode" increases, delay elements are sequentially selected from the left side to the right side in FIG. 5. In the blocks BLK1 and BLK3, when the number of delay elements selected by an input code "icode" increases, delay elements are sequentially selected from the right side to the left side in FIG. 5.

Sub-decode signals are generated from the main decode signals and block decode signals bds0 to bds 3 output from block decoders bd-0 to bd-3. FIG. 9 illustrates sub-decode signals SDz input to the sub-decoders of each of the delay elements du-0 to du-15. The clock signal CLK is looped back at a delay element where a sub-decode signal SDz adjacent to "0" becomes "1", in other words, the sub decode signal SDz becomes H level.

Now, an operation will be described. For example, if the input code "icode" becomes "0010", the block decode signal bds is "1111." Moreover, the main decode signal mds is "0011."

Figure 10:
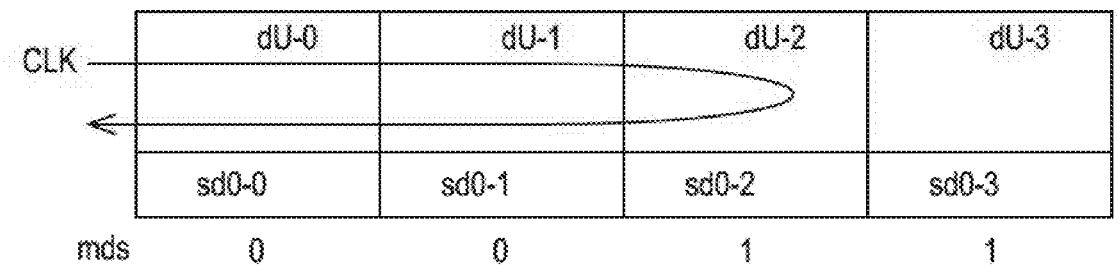
FIG. 10 illustrates an operation of the delay elements in FIG. 5.

As illustrated in FIG. 10, the input clock signal CLKin is looped back at the delay element du-3 via delay elements du-0 and du-1, and output as the output clock signal CLKout via the delay elements du-1 and du-0.

Therefore, in this condition, the output clock signal CLKout is delayed for three stages of delay elements corresponding to the input clock signal CLKin.

If an input code icode becomes "1011", the block decode signal bds becomes "0011", and the main decode signal mds becomes "0001." Then, an input clock signal CLKin is looped back at the delay element du-11 via the delay elements du-0 to du-10 and output as the output clock signal CLKout via the delay elements du-10 to du-0.

Thus, in this condition, the output clock signal CLKout is delayed for 12 stages of delay elements corresponding to the input clock signal CLKin.

Moreover, if an input code "icode" becomes "1111", the block decode signal bds is "0001", and the main decode signal mds is "1111." Then, the input clock signal CLKin is looped back at the du-15 via delay elements du-0 to du-14, and output as an output clock signal CLKout via the delay elements du-14 to du-0.

Accordingly, in this condition, the output clock signal CLKout is delayed for 16 stages of delay elements corresponding to the input clock signal CLKin.

FIG. 11 illustrates a relationship between an input code "icode" and a main decode signal mds when the number of delay elements of blocks BLK0 to BLK3 is 64. FIG. 12 illustrates a relationship between input code "icode" and sub-decode signals SDz of blocks BLK0 to BLK2. These main decode signal mds and sub decode signal SDz allows the selection of a delay time for an output clock signal CLKout in units of one within a range of 1 to 256 stages.

Figure 14:
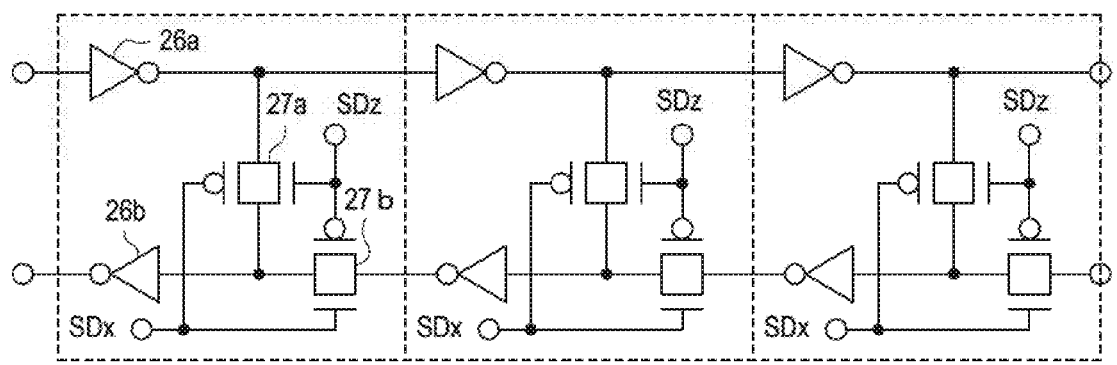
FIG. 14 illustrates another example of the delay elements in FIG. 5.

FIG. 14 illustrates another example of a delay element array. Delay elements that make up the delay element array include inverter circuits 26a and 26b, and transfer gates 27a and 27b. Sub-decode signals SDz are input to an N channel side gate of the transfer gate 27a and a P channel side gate of the transfer gate 27b. Sub-decode signals SDx are input to a P channel side gate of the transfer gate 27a and an N channel side gate of the transfer gate 27b.

In above configuration, if the sub-decode signal SDz becomes H level and the sub-decode signal SDx becomes L level, the transfer gate 27a is turned to a conductive state and the transfer gate 27b is turned to a non-conductive state. Then, a clock signal output from the inverter circuit 26a is looped back via the transfer gate 27a, and output to the inverter circuit 26b.

Moreover, if the sub-decode signal SDz becomes L level and a sub-decode signal SDx becomes H level, the transfer gate 27a is turned to a non-conductive state and the transfer gate 27b is turned to a conductive state. Then, inverter circuits 26a and 26b turn into a condition to transfer a clock signal CLK output from inverter circuits of delay elements adjacent to the inverter circuits 26a and 26b respectively. Thus, the delay elements in FIG. 14 operate in the similar manner as the delay elements in FIG. 8.

In above described digital circuit, the following effects may be achieved.

The delay time of an output clock signal CLKout corresponding to an input clock signal CLKin may be adjusted by an input code "icode" for a delay time of one delay unit du as a minimum step.

Figure 13:
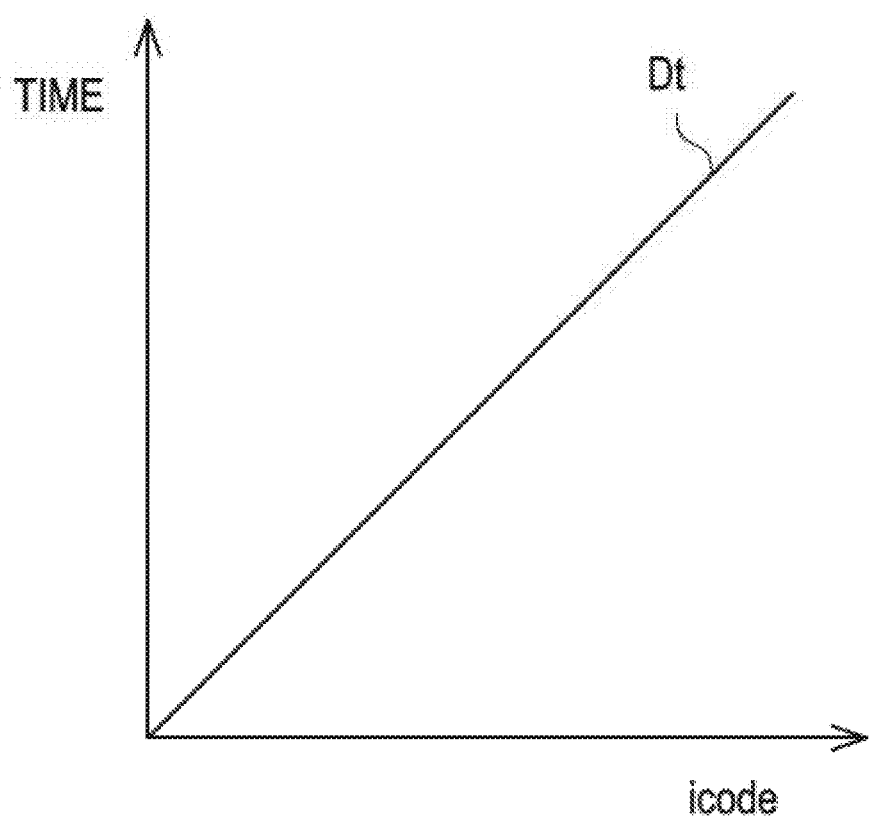
FIG. 13 illustrates a relationship between input codes and the delay times.

When a delay time of an output clock signal CLKout is adjusted at the minimum step, the number of delay elements selected is increased or decreased in units of one stage of delay elements coupled serially. Therefore, as illustrated in FIG. 13, by adjusting the input code "icode", linearity of changes in delay times Dt of output clock signals CLKout may be improved.

When a delay time of an output clock signal CLKout is adjusted at the minimum step by the main decoder 12, the block decoder unit 13, and the sub-decoder 14, the number of stages of delay elements coupled serially may be increased or decreased in units of one stage based on the input code "icode."

For example, when delay elements are increased or decreased across different adjacent blocks such as from a block BLK0 to block BLK1, the number of delay elements may be increased or decreased by one.

In adjacent blocks, since the direction along which delay elements are increased or decreased may be reversed, a wiring length between delay elements coupled across different adjacent blocks, for example, from block BLK 0 to block BLK1, may be shortened. As a result, variations in wiring lengths among delay elements may be reduced and variations in minimum steps of delay times may be reduced.

By operating the main decoder 12, the block decoder unit 13, and the sub-decoder 14 hierarchically, the circuit configuration of each decoder may be simplified.

No decoder is interposed in a transfer route of a clock signal CLK, thus the accuracy of the delay time of a delay clock signal may be improved.

The above embodiment may be embodied by the mode described below. If a delay due to wiring is small, a direction for increasing and decreasing the number of delay elements in each delay element array may be the similar direction. According to the above embodiment, a linearity of delay steps is ensured while a delay time may be selected in multiple delay steps.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A delay signal generator comprising:
   a delay element array which is divided into a plurality of blocks, and the plurality of blocks are arranged in parallel;
   a decoder including a main decoder, a block decoder and a sub decoder, the block decoder to receive an input code and output a block decode signal, the main decoder to receive the input code and output a main decode signal based on the input code, the sub decoder to receive the main decode signal and the block decode signal and output a selection signal based on the main decode signal and the block decode signal; and
   wherein each plurality of blocks includes a plurality of delay elements delay an input signal through a first transfer route or a second transfer route;
   wherein each of the plurality of delay elements selects the first transfer route or the second transfer route in response to the selection signal.

2. The delay signal generator according to claim 1, wherein the main decoder includes a first selector to select the input code and an inverted input code based on the block decode signal and decodes a selected signal.

3. The delay signal generator according to claim 2, wherein the sub-decoder is provided for each of the plurality of delay elements.

4. The delay signal generator according to claim 2, wherein the main decoder generates the main decode signal so as to control a number of the plurality of delay elements used in at least one of the plurality of blocks.

5. The delay signal generator according to claim 2, wherein each of the plurality of delay elements includes a second selector for selecting either the first transfer route or the second transfer route based on the selection signal.

6. The delay signal generator according to claim 5, wherein the second selector comprises:
a first NAND circuit and a second NAND circuit whose input terminals are coupled to the first transfer route;
a third NAND circuit whose input terminals are coupled to the second transfer route;
wherein, the selection signal including a complementary signal is input to the first NAND circuit and the second NAND circuit.

7. The delay clock generator according to claim 5, wherein the selector comprises:
a first inverter circuit that is interposed in the feed side transfer line;
a second inverter circuit that is interposed in the feed side transfer line, and has a first transfer gate interposed between an input terminal and the return side transfer line; and
a second transfer gate that is interposed between an output terminal of the first inverter circuit and an input terminal of the second inverter circuit;
wherein either the first transfer gate or the second transfer gate is made conductive by the sub-decode signal.

8. The delay signal generator according to claim 1, wherein the first transfer route for transferring an input signal to an adjacent block via at least one of a plurality of delay elements included in each plurality of blocks, the second transfer route for transferring the input signal back to an input-signal-supplying side via at least the other delay element of the plurality of delay elements.

* * * * *